US012676548B1

(12) United States Patent
Fishman et al.

(10) Patent No.: US 12,676,548 B1
(45) Date of Patent: Jul. 7, 2026

(54) COMPACT UNIVERSAL BIDIRECTIONAL EFFICIENT DC-TO-DC CONVERTER FOR HIGH CAPACITY ALTERNATIVE ENERGY SYSTEMS

(71) Applicant: SCHNEIDER ELECTRIC IT CORPORATION, Foxboro, MA (US)

(72) Inventors: Oleg Fishman, Maple Glen, PA (US); Hanan Fishman, Fort Washington, PA (US); Michael D. Muhlbaier, Langhorne, PA (US); Zekeriya Dereli, Horsham, PA (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 967 days.

(21) Appl. No.: 17/738,528

(22) Filed: May 6, 2022

Related U.S. Application Data

(60) Provisional application No. 63/186,306, filed on May 10, 2021.

(51) Int. Cl.
| | |
|---|---|
| *H05K 3/00* | (2006.01) |
| *H02J 3/38* | (2006.01) |
| *H02M 3/155* | (2006.01) |
| *H05K 7/20* | (2006.01) |

(52) U.S. Cl.
CPC ............ *H02M 3/155* (2013.01); *H02J 3/381* (2013.01); *H05K 7/20145* (2013.01); *H05K 7/20172* (2013.01); *H05K 7/202* (2013.01); *H05K 7/20509* (2013.01); *H02J 2300/20* (2020.01)

(58) Field of Classification Search
CPC .......... H02J 1/102; H02J 2300/26; H02J 3/38; H02J 3/46; H02J 7/0013; H02J 9/061;
H02J 1/10; H02J 2207/20; H02J 2300/20; H02J 2300/28; H02J 2300/30; H02J 3/0075; H02J 3/28; H02M 3/33573; H02M 1/007; H02M 1/0064; H02M 3/33584; H02M 7/5387; H05K 9/0007

USPC ......................................................... 361/676
See application file for complete search history.

(56) References Cited

U.S. PATENT DOCUMENTS

| | | | | |
|---|---|---|---|---|
| 11,689,092 | B1* | 6/2023 | Nasiri | H02M 1/007 363/21.03 |
| 12,051,971 | B1* | 7/2024 | Wright | H05K 7/20236 |
| 2015/0326108 | A1* | 11/2015 | Augustoni | H02M 3/158 307/82 |
| 2016/0372926 | A1* | 12/2016 | Pahlevaninezhad | H02M 7/48 |
| 2017/0126114 | A1* | 5/2017 | MacLennan | H02M 1/126 |
| 2018/0102646 | A1* | 4/2018 | Apte | H02J 1/14 |

(Continued)

FOREIGN PATENT DOCUMENTS

| | | | | |
|---|---|---|---|---|
| EP | 2378122 A2 * | 10/2011 | | F04C 29/045 |

*Primary Examiner* — Mandeep S Buttar
(74) *Attorney, Agent, or Firm* — Quinn IP Law

(57) ABSTRACT

A high power density DC-to-DC converter has a high efficiency and a bidirectional or a unidirectional universal configuration. The high power density DC-to-DC converter can be housed in a compactly-arranged converter enclosure. A plurality of the high power density DC-to-DC converters can be configured with converter input connections to a plurality of high power renewable energy sources. The converter outputs for all of the plurality of the high power density DC-to-DC converters can be connected to a DC inverter input of one or more DC-to-AC inverters with each of the inverters having an AC inverter output connected to an electrical grid.

20 Claims, 14 Drawing Sheets

(56)                    References Cited

U.S. PATENT DOCUMENTS

2020/0195148 A1 *    6/2020   Wen ........................... H02J 7/02
2022/0289067 A1 *    9/2022   Adegbohun ...... H01M 10/6554
2023/0356607 A1 *   11/2023   McAlwee ............... B60L 53/57

* cited by examiner

COMPACT UNIVERSAL BIDIRECTIONAL EFFICIENT DC-TO-DC CONVERTER FOR HIGH CAPACITY ALTERNATIVE ENERGY SYSTEMS

CROSS REFERENCE TO RELATED APPLICATIONS

This application claims priority to U.S. Provisional Application No. 63/186,306 filed May 10, 2021, hereby incorporated by reference in its entirety.

FIELD OF THE INVENTION

The present invention relates to a high power density, compact-sized and environmentally rugged DC-to-DC converter for high capacity alternative energy systems where the DC-to-DC converter forms a compact universal unidirectional or bidirectional efficient (referred to as a "CUBE") DC-to-DC converter that transmits power via a DC bus or otherwise to DC-to-AC power inverters (DC/AC inverter) connected to an electric grid or other high capacity AC power system which are generally referred to as a high capacity AC power system. For convenience a DC-to-DC converter of the present invention is also referred to herein as a high power density DC-to-DC converter.

BACKGROUND OF THE INVENTION

The terms "high capacity alternative energy system" and "utility-scale alternative power system" (or "power plant") as used herein apply to such systems having a minimum rated design power output (as understood in the art) of at least 500 kilowatts and also to components used in such systems. Components of utility-scale alternative power systems include direct current (DC) power sources and DC-to-AC power inverters.

FIGS. 1(a), 1(b), 1(c) and 1(d) illustrate typical DC power sources used herein as "renewable DC power energy sources." In FIG. 1(a) the DC power source consists of multiple arrays of photovoltaic (solar) panels 11 harvesting solar energy and transferring this energy (via DC bus 70) into an AC power grid via inverter 72 and storing a portion of the energy in storage batteries 18; fuses 22 and disconnects 23 are used to protect and isolate the DC BUS. In FIG. 1(b) the DC power source is at least one wind turbine power generator configured in this example as the assembly of an AC/DC inverter 14, AC generator 15 and DC generator 16 with rotor and wind turbine blades. In FIG. 1(c) the DC power source is at least one fuel energy cell 17. In FIG. 1(d) the DC power source is at least one DC storage battery 18. The term "DC power source" as used herein can include a mixed combination of typical DC power sources shown in FIG. 1(a) to FIG. 1(d). For example, the output of a plurality of photovoltaic batteries supplied with solar energy from an array of photovoltaic panels can be combined with the output of DC storage batteries supplied with wind energy from a plurality of wind power AC/DC inverters 14 connected to a plurality of wind turbine power generator assemblies to form a utility-scale alternative power plant. A DC-to-AC inverter 72 (also referred to as DC/AC inverter) shown in FIG. 1(a) through FIG. 1(d) converts DC power supplied from DC bus 70 into AC power having a three-phase sinusoidal wave with voltage characteristics that are compatible with the AC electric grid to which the output of DC-to-AC inverter 72 is connected.

One shortcoming of a utility-scale alternative power plant in the utility-scale alternative power system is that while the grid voltage is stable, the output voltages of the DC power sources connected to DC bus 70 in FIGS. 1(a) to 1(d) are not; a DC-to-AC inverter with appropriate DC voltage regulation characteristics can mitigate the DC bus voltage instability.

The voltage fluctuations at the outputs of the DC power sources and on the connected DC bus 70 requires entire system design consideration that can accommodate the highest possible voltage at one end of the design spectrum and highest possible current at the other end of the design spectrum.

The traditional solution of collecting and delivering power from the DC power sources is uneconomical because of the required long lengths of DC cables, fuses and disconnects (collectively known in the art as the "balance of the system" or "BOS"). The DC bus connecting DC power sources with the DC-to-AC inverter still must be designed for the maximum possible current and voltage.

As illustrated in FIG. 2(a) and FIG. 2(b) a better solution is to stabilize the voltage near the DC power source and maximize the volage and supply stable DC bus voltage to meet the requirements of the grid by installing DC/DC regulators 20 (known in the art as DC/DC converters) near the DC power sources without long lengths of DC cables. This provides significant cost reductions of all BOS components, since the BOS components can be rated for lower current capacity, however there is an additional cost for the DC/DC converters. The cost of DC-to-AC inverter 72 is also reduced by removing the requirement for a DC voltage regulator as part of the DC bus-connected DC-to-AC inverter 72.

The utility-scale alternative power plant with stable high voltage collection of energy from DC power sources with the DC voltage converters 20 in proximity to the DC power sources is shown alternatively in FIG. 2(a) and FIG. 2(b). In FIG. 2(a) a high voltage power collection system 25 comprises a plurality of BOS components 71 consisting of multiple groups of DC cables 21, fuses 22 and disconnects 23.

DC/DC converters 20 near to the DC power sources without long lengths of DC cables in FIG. 2(a) and FIG. 2(b) can be unidirectional, for example, as shown in FIG. 2(a) with a stepping-up of the voltage between a plurality of photovoltaic modules 11 and DC-to-AC inverter 72. Alternatively the DC/DC converters 20 may be bidirectional, for example, as shown in FIG. 2(b), where the battery voltage is stepped-up when battery 18 is supplying power to bus DC-to-AC inverter 72 and stepped-down when battery 18 is being charged from bus DC-to-AC inverter 72.

In many cases the system design requires different ground potential references for some of the DC power sources, for example, photovoltaic arrays 11, wind turbine power AC-to-DC inverter 14, or fuel energy cell 17 and the DC input of the DC-to-AC inverter in FIG. 1(a) to FIG. 1(c). In these situations the DC/DC converter has an additional requirement of providing a galvanic isolation between the required DC power source and sources and DC-to-AC inverter 72.

U.S. Pat. No. 9,627,889 B2 (Fishman, et. al) presents a high voltage energy harvesting and conversion renewable energy utility-size electric power system. The harvesting network includes distributed renewable energy power optimizers and transmitters that control delivery of renewable energy. These power optimizers are used as DC/DC converters with galvanic isolation between input and output. U.S. Pat. No. 9,627,889 B2 is incorporated herein by reference in its entirety.

When the alternative power utility-scale solar plant is augmented with a stored energy source the issue becomes even more complicated. One solution is proposed in U.S. Pat. No. 10,483,759 B2 (Fishman) that discloses an integrated multi-mode, large-scale electric power support system supplies on demand at least 2,500 kW to an electrical grid either from co-located solar, wind or fuel energy cell renewable energy DC power sources, or in combination with, or alternatively, from system stored energy DC power sources via a plurality of DC-to-AC inverters with phase-shifted outputs and solar power optimizers; U.S. Pat. No. 10,483,759 B2 is incorporated herein by reference in its entirety.

In a utility-scale solar power plant, a plurality of PV solar cells 11 as shown, for example in FIG. 1(*a*), can be regulated by a solar energy collection regulation system and then connect to direct current (DC) bus 70 for either storage or supplied to alternating current (AC) electrical grid via a suitable DC-to-AC inverter system 72. One example of suitable inverter system is a regulated current source inverter system as disclosed in U.S. Pat. No. 8,212,408 B2 (Fishman) which is incorporated herein by reference in its entirety.

U.S. Pat. No. 8,212,408 B2 (Fishman) discloses common collection of photovoltaic-generated and wind-generated electric power in a nodal arrangement and transported at high voltage DC to a plurality of regulated current source inverters to supply to the conventional AC electrical transmission system; U.S. Pat. No. 8,212,408 B2 is incorporated herein by reference in its entirety.

In the galvanically isolated DC/DC converters the input DC voltage from DC power sources is converted into high frequency voltage applied to a transformer primary winding. The AC voltage from the transformer secondary winding is rectified and applied to DC bus 70. The galvanically isolated DC/DC converter output voltage can be higher or lower than input voltage depending on the primary to secondary winding turn ratio. The output voltage can also be dynamically regulated by electronic means.

U.S. Pat. No. 9,118,215 B2 (Fishman et al.) and U.S. Pat. No. 9,350,166 B2 (Fishman et al) disclose renewable energy, utility size electric power systems that have high voltage, renewable energy harvesting networks connected via plurality of galvanically isolated DC/DC converters to a centralized grid synchronized multiphase regulated current source inverter system. U.S. Pat. No. 9,118,215 B2 and U.S. Pat. No. 9,350,166 B2 are incorporated herein by reference in their entireties.

With the large magnitude of electrical energy collected, in a utility-scale solar power plant, maximum optimization of the energy collection, which is the cost of the components, becomes a significant factor for consideration. The size and cost of DC/DC converters is a major component consideration.

In other applications where galvanic isolation is not required a simpler circuit of voltage step-up or step-down DC/DC converter may be implemented. One example of a step-up and step-down implementation is disclosed in the U.S. Pat. No. 8,130,518 B2 (Fishman et al.) and U.S. Pat. No. 8,213,199 B2 (Fishman et al) as a part 12a and 12b of Regulated Current Source Inverter. U.S. Pat. No. 8,130,518 B2 and U.S. Pat. No. 8,213,199 B2 are incorporated herein in their entireties.

In general, these step-up and step-down regulators without galvanic isolation between input and output are known in the art as boost and buck converters, respectively. FIG. 3(*a*) illustrates a typical diagram of a combination boost/buck DC/DC converter. The converters consist of four switches: S1, S2, S3 and S4 shunted by four diodes: D1, D2, D3 and D4, respectively, with an inductor L (25) connected between S1 and S4 at a first inductor terminal and S2 and S3 at a second inductor terminal.

For step-up (boost) operation V1 voltage (input) is less than V2 voltage (output). Referring to FIG. 3(*a*) and FIG. 3(*b*) for boost operation, switch S1 is permanently closed and switch S4 is permanently open. Initially the input voltage V1 is applied to the converter's input and charges output capacitor C2 (24) to input voltage V1 via diode D2, until voltage V2 is equal to voltage V1. Then the step-up process begins. As shown in FIG. 3(*b*) time period T is divided into time segments (1-D)·T and D·T where D is a duty cycle. To step up the output voltage V2 as shown in FIG. 3(*b*), switch S3 is periodically closed within every time period T for time segment (1-D)·T. During the time segment (1-D)·T, input voltage V1 is applied to inductor L (25). Current through inductor L (25) increases storing energy in the inductor L (25), as illustrated in FIG. 3(*b*). When switch S3 is opened, the energy accumulated in inductor L (25) discharges into output capacitor C2 (24) over the time segment DT. The voltage across inductor L (25) is reversed V1-V2 as shown in FIG. 3(*b*).

In step-up operation the output voltage V2 is increased according to equation 1:

$$V2 = V1 \cdot (1-D) \qquad \text{(equation 1).}$$

For step-down (buck) operation voltage V1 (input) is greater than V2 (output). Referring to FIG. 3(*a*) and FIG. 3(*c*) switches S2, S3 and switch S4 are permanently open. To step down the output voltage V2 as shown in FIG. 3(*c*), switch S1 is periodically closed for time segment (1-D). During the time segment (1-D), the voltage equal to (V1-V2) is applied to inductor L (25) and current flows through switch S1, inductor L (25) and diode D2. The energy is accumulated in the inductor L (25). Then the switch S1 is opened, the current in the inductor L (25) flows through diode D4, inductor L (25) and diode D2, the voltage across inductor L (25) is reverse causing the current in the inductor L (25) to diminish.

In step-down operation the output voltage V2 is decreased according to equation 2:

$$V2 = V1 \cdot (1-D) \qquad \text{(equation 2).}$$

Shortcomings in the utilization of boost/buck DC/DC converters is high cost, relatively large size and low power density (typically in the range of 10 kilowatts per cubic foot) that may not justify traditional replacement of BOS components. A typical overall sizing of a boost/buck DC/DC converter known in the art is shown in FIG. 4(*a*) with overall front length L dimension of 40 inches×80 inches×40 inches.

When used in alternative energy generation systems and/or energy storage systems, the buck circuit or boost circuit commutate high voltages (up to 1,500 volts) and large currents (up to 750 amperes). Converters in these applications are generally installed in open fields and exposed to ambient temperatures up to 55° C. The state of the art used in alternative energy DC/DC converters rated at 500 kW (see, for example, FIG. 4(*a*)) are packaged in 74 cubic foot cabinets (40 inches×80 inches×40 inches) with a power density of 6.75 KW per cubic foot.

It is one object of the present invention to provide a compact unidirectional or bidirectional 98 to 99.5% efficient DC/DC converter for high capacity alternative energy power systems comprising a minimum 500 kW rated DC/DC converter in a 6.12 cubic feet enclosure (22-inch by 22-inch by 22-inch as shown, for example, in FIG. 4(*b*)) with a power density of 81.36 KW per cubic foot.

The DC/DC converter is universal meaning it is configurable to step-up or step-down the voltage in one direction (input-to-output) or to step-up or step-down the voltage in opposite direction (output-to-input).

It is another object of the present invention to provide a compact unidirectional or bidirectional efficient DC/DC converter for high capacity alternative energy power systems with a high power rating typically in the range of 500 kW to 1,000 kW operating as a step-up/step-down or alternatively operating as a step-up or step-down DC/DC converter (as shown, for example, in FIG. 4(*b*)).

It is another object of the present invention to provide a compact unidirectional or bidirectional efficient DC/DC converter for high capacity alternative energy power systems that is cost efficient, compact and power efficient.

It is one object of the present invention to provide a compact unidirectional or bidirectional efficient DC/DC converter for high capacity alternative energy power systems with at least 12 times higher power density than prior art DC/DC converters.

BRIEF SUMMARY OF THE INVENTION

In one aspect the present invention is a high power density DC/DC converter utilizing high frequency commutation to minimize the converter's enclosure volume to 6.2 cubic feet and to maximize the conversion power density to at least 80 KW per cubic feet.

In another aspect the present invention is a high power density DC/DC converter that utilizes Silicon Carbide (SIC) MOSFET semiconductors to facilitate fast high frequency switching.

In another aspect the present invention is a high power, high frequency DC/DC converter that minimizes cost by minimizing the size of passive power components in the converter including a converter's compact power inductor.

It is another aspect the present invention is a high frequency DC/DC converter with a self-contained closed fluid cooling system to facilitate size minimization of the high frequency DC/DC converter.

In another aspect the present invention is a high frequency DC/DC converter with converter control electronics and converter power electronic components integrated in one printed circuit board to facilitate converter cost minimization.

In another aspect the present invention is a universal high frequency DC/DC converter that can be configured to operate as a step-up DC-DC converter, or a step-down DC/DC converter, or as a selectable step-up/step-down DC/DC converter.

The above and other aspects of the invention are further set forth in this specification and the appended claims.

BRIEF DESCRIPTION OF THE DRAWINGS

Illustrations of the present invention shown in the drawings in a form that is presently preferred; it being understood, however, that this invention is not limited to the precise arrangements and instrumentalities shown.

FIG. 3(*b*) graphically illustrates voltage and current characteristics of the boost mode of the boost-buck DC converter in FIG. 3(*a*).

FIG. 3(*c*) graphically illustrates voltage and current characteristics of the buck mode of the boost-buck DC converter in FIG. 3(*a*).

FIG. 6(*b*) schematically illustrates one example of a high power density DC-to-DC converter of the present invention in buck mode configuration that utilizes Silicon Carbide (SiC) MOSFET technology and transistors.

FIG. 6(*c*) diagrammatically illustrates one example of the high power density DC-to-DC converter of the present invention in an interleaved buck/boost configuration utilizing SiC MOSFET technology and transistors.

FIG. 7(*b*) is a diagrammatic top view in top view one example of attachment of the SiC MOSFET modules 40 (not visible in FIG. 7(*b*)) to a fluid chill plate 51 in one example of a high power density DC-to-DC converter of the present invention for being housed in a compactly-arranged converter enclosure.

FIG. 7(*c*) is a second diagrammatic bottom view of relative positioning of the DC-to-DC converter single converter control circuitry board 50 and the two SiC MOSFET modules 40 utilized in one example of the present invention.

In some examples of the invention reconnectable bus bars are provided in the compactly-arranged converter enclosure to facilitate alternative configurations of the high power density DC-to-DC converter of the present as for a boost mode; a buck mode; or a boost/buck mode operational high power density DC-to-DC converter.

FIG. 8(*a*) is a perspective external view of one example of a compact universal unidirectional or bidirectional efficient DC-to-DC converter of the present invention with side removable enclosure panels installed for the compactly-arranged converter enclosure.

FIG. 8(*b*) is a perspective external view of the compact universal unidirectional or bidirectional efficient DC-to-DC converter shown in FIG. 8(*a*) with side removable enclosure panels removed. The compact universal bidirectional DC-to-DC converter housed in the compactly-arranged converter enclosure.comprises electrical, electronic, mechanical and water-cooling components disclosed in this application.

FIG. 9(*a*) diagrammatically illustrates one example of a self-contained fluid cooling system for a compact universal unidirectional or bidirectional efficient DC-to-DC converter of the present invention.

FIG. 9(*b*) illustrates one example of the self-contained fluid cooling system installed in the compact universal unidirectional or bidirectional efficient DC-to-DC converter shown diagrammatically in FIG. 9(*a*).

Figure 10:
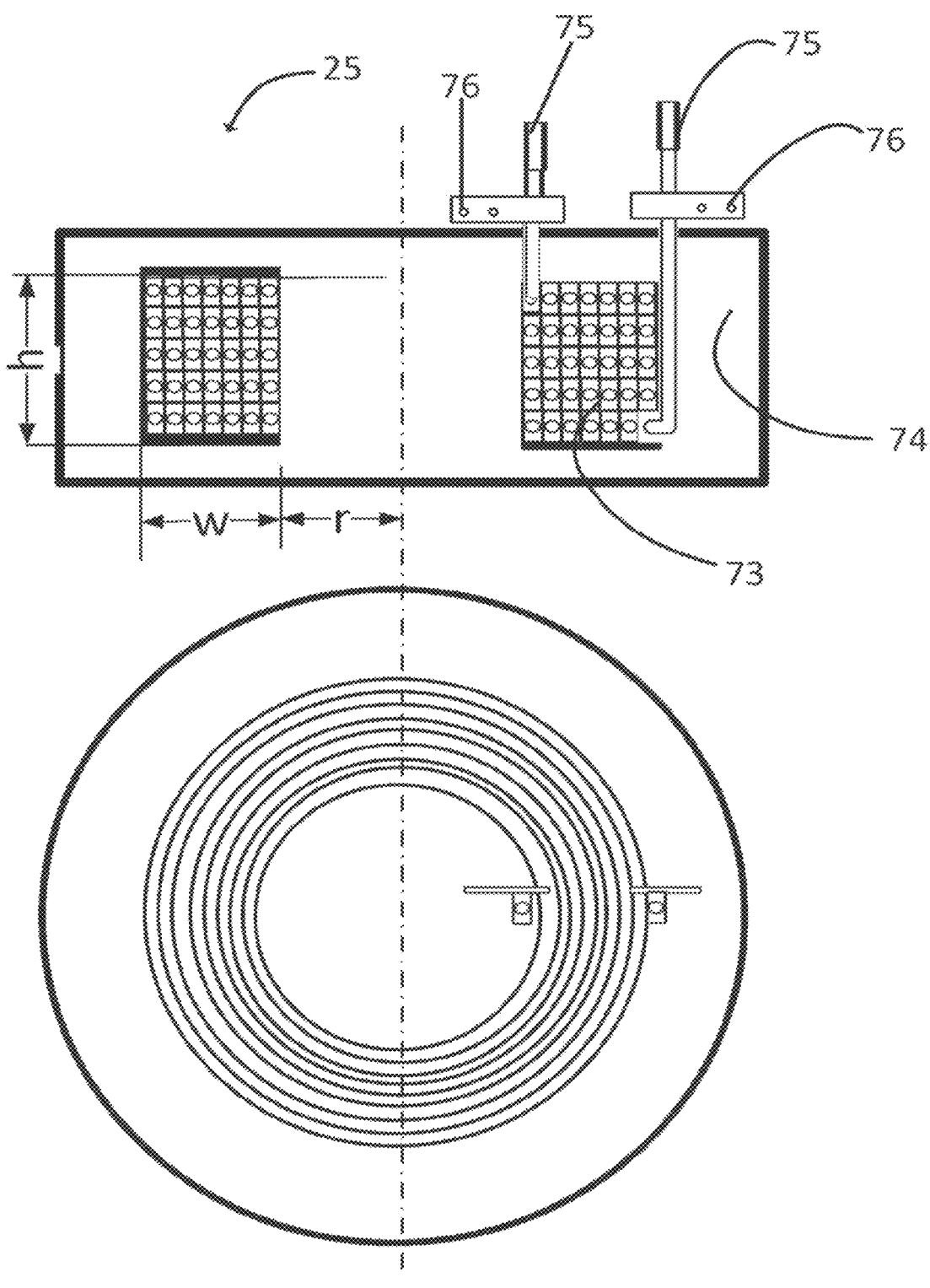

FIG. 10 illustrates one example of a fluid cooled compact power inductor known in the art and utilized in selected embodiments of a compact universal unidirectional or bidirectional efficient DC-to-DC converter of the present invention.

DETAILED DESCRIPTION OF THE INVENTION

For convenance a compact universal unidirectional or bidirectional efficient (CUBE) DC-to-DC converter of the present invention is also referred to herein as a high power density DC-to-DC converter.

In one embodiment of a compact universal unidirectional or bidirectional efficient (CUBE) DC-to-DC converter of the present invention, as disclosed herein where a significant reduction in the overall physical size and cost over the prior art for DC-to-DC converters are achieved in part by a combination of two or more of the following technical features over the prior art:

a) increasing the switching frequency (in the range of 50 kHz to 150 kHz) of power switching semiconductors used in a CUBE DC-DC converter for alternative energy systems by at least fourfold over the prior art;

b) integration of the converter's digital control circuits with the power switching semiconductors in a single converter control circuitry board;

c) self-contained DC-to-DC converter forced fluid cooling system; and d) a novel energy storing power inductor for the high power density DC-to-DC converter.

The main electrical components in high power density DC-to-DC converters are power switching semiconductors and major reactive components such as the converter's energy storing power inductor(s) and capacitor(s). The electrical rating (inductance (L) for the inductor or capacitance (C) for the capacitor), size and weight of the energy storing power inductor and capacitor are approximately inversely proportional to the commutation frequency (F_commutation) of the DC-to-DC converter as represented by the following equations:

$$L \sim \frac{1}{F\_commutation} \qquad \text{(equation 3)}$$

and $$C \sim \frac{1}{F\_commutation}. \qquad \text{(equation 4)}$$

Cost reduction and physical size of an enclosed high power density DC-to-DC converter in the present invention is achieved in part through minimizing the size of major reactive components for the enclosed high power density DC-to-DC converter.

Figure 5:
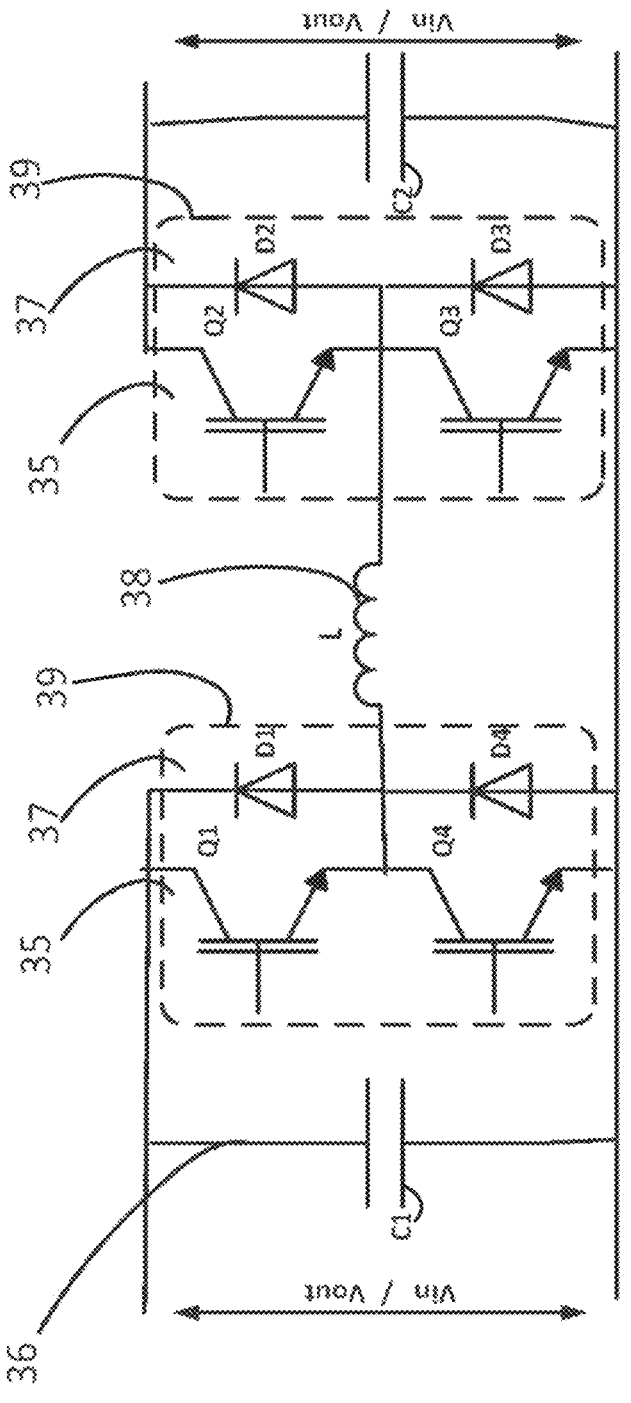
FIG. 5 schematically illustrates one example of an existing boost/buck DC/DC converter utilizing Insulated Gate Bipolar Transistor (IGBT) technology and transistors.

With reference to FIG. 5, prior art high power DC-to-DC converters suitable for use in alternative energy power systems utilize switching modules 39 (each module bounded by a dashed box) in FIG. 5 formed with silicon insulated gate bipolar transistors 35 (IGBT) for switches Q1, Q2, Q3, and Q4 and silicon diodes 37 for diodes D1, D2, D3 and D4 which have relatively high commutation losses due to significantly high parasitic capacitance for the transistors and reverse recovery charge of the diodes. Therefore the commutation frequency is limited to between 5 kHz and 10 kHz. Additionally the physical size of suitable high power IGBT switching modules known in the art, for example, Infineon Technologies AG module FD1000R33HE3-K have a relatively large overall physical size of 250 mm×89 mm×38 mm and a physical assembly that is not compatible with a configuration where control components for the DC-to-DC converter control components are disposed on the same circuit board or suitable substrate as the IGBT modules.

Figure 6A:
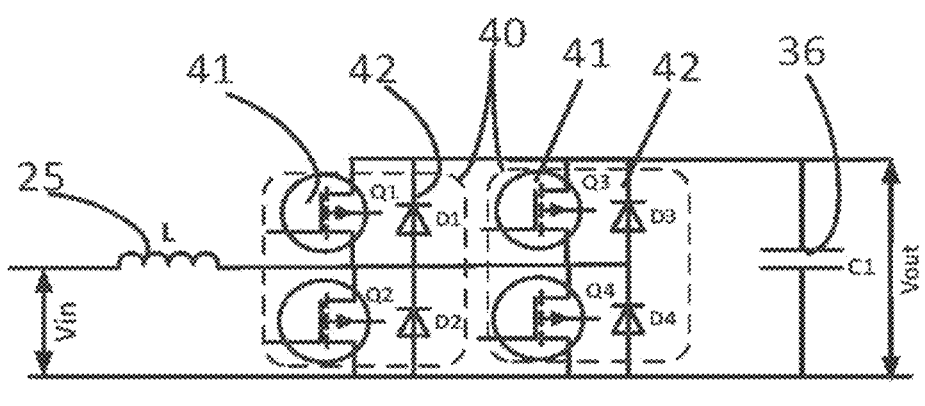
FIG. 6(*a*) schematically illustrates one example of a high power density DC-to-DC converter of the present invention in boost mode configuration that utilizes Silicon Carbide (SiC) MOSFET technology and transistors.
Figure 6B:
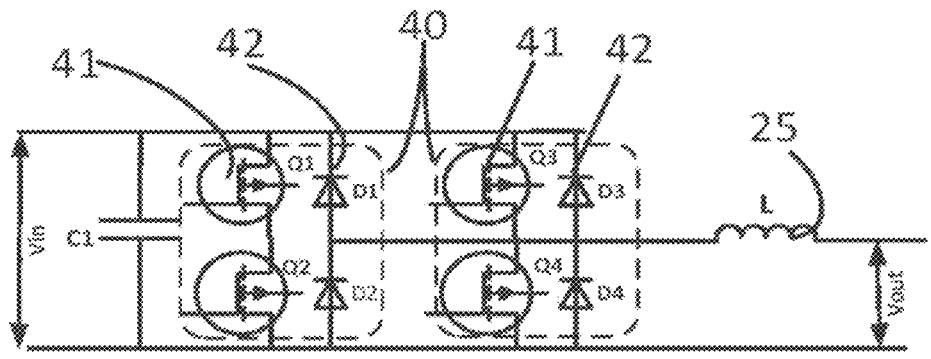

In one embodiment of the present invention the high power compact universal unidirectional or bidirectional efficient DC-to-DC converter utilizes fast high power Silicon Carbide (SiC) metal oxide field effect transistors (MOSFET) 41 as illustrated in FIG. 6(*a*) to FIG. 6(*c*). SiC MOSFETs have much less parasitic capacitance than IGBT transistors; and Schottky SiC diodes 42 with no recovery charge. Implementation of SiC MOSFETs and Schottky SiC diodes result in much lower switching and conduction losses than the prior art and allows commutation currents up to 750 amperes and voltages up to 1500 volts at frequencies ranging from 50 kHz to 150 kHz.

Furthermore SiC MOSFET modules, for example, ROHM Co. Ltd. module BSM600D12P3G001 have a smaller footprint and overall smaller physical dimensions (150 mm×59 mm×17 mm) than functionally equivalent IGBT modules and the SiC MOSFET module is configured for integration in a single converter control circuitry board with the digital control circuitry for the high power density DC-to-DC converter as shown diagrammatically in FIG. 7(*a*) and FIG. 7(*b*) in one embodiment of a high power density DC-to-DC converter of the present invention.

According to equations 3 and 4 above, utilization of higher frequency SiC semiconductors in a high power density DC-to-DC converter of the present invention results in a physical size reduction of 350 percent for each of the DC-to-DC converter power inductor (25) and capacitor C1 (26).

Figure 7A:
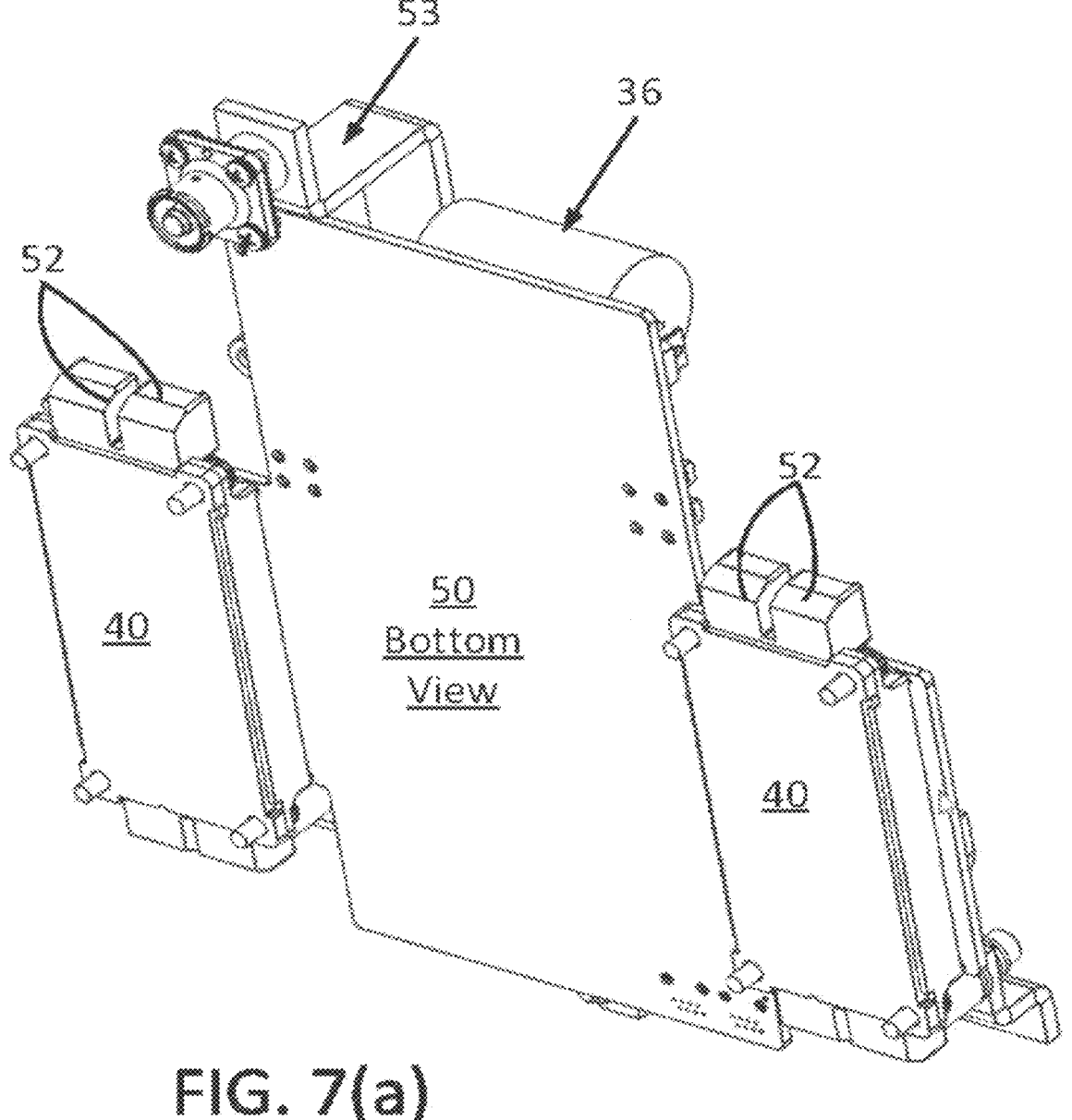
FIG. 7(*a*) is a diagrammatic bottom view of one example of physical positioning of the SiC MOSFET modules 40 below a single DC-to-DC converter control printed circuit board 50 in one example of a high power density DC-to-DC converter of the present invention for being housed in a compactly-arranged converter enclosure.
Figure 7B:
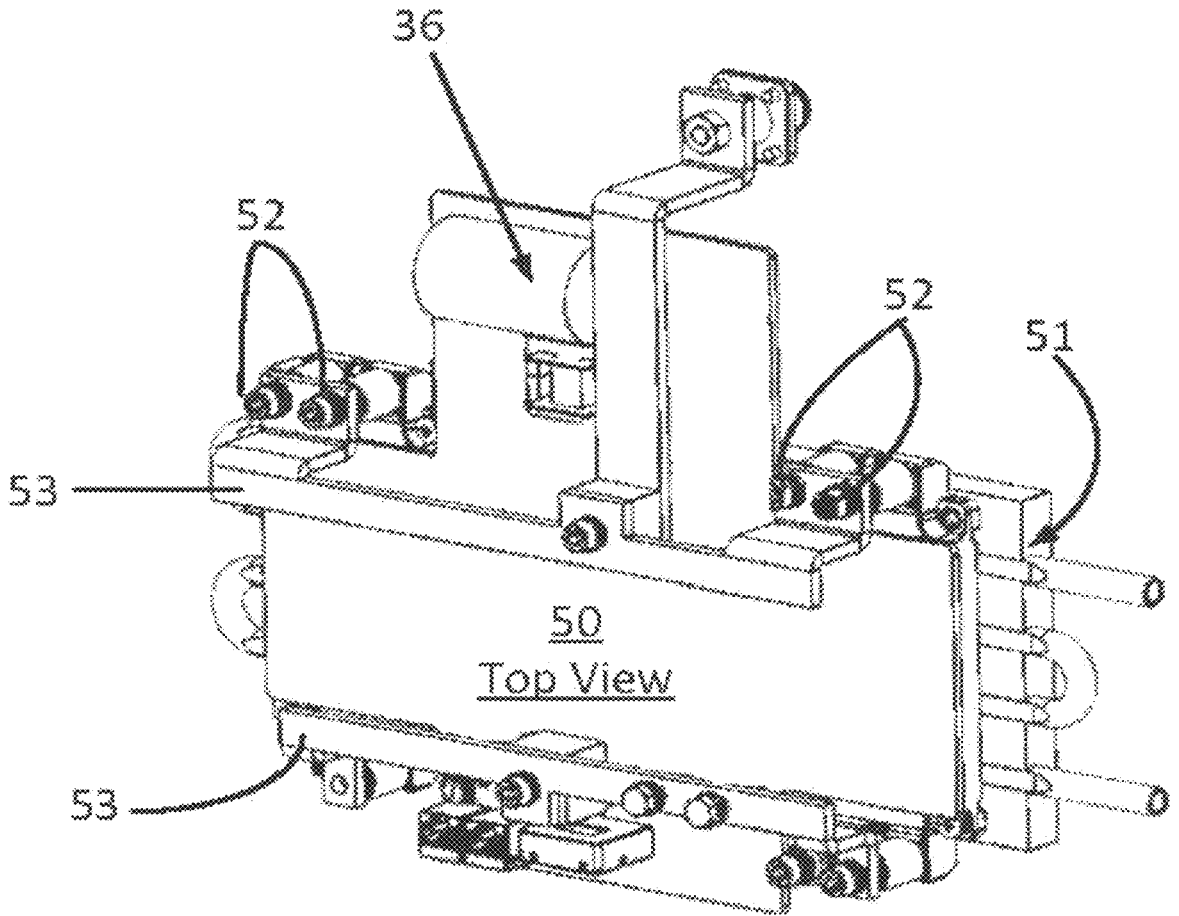

FIG. 7(*a*) diagrammatically illustrates one embodiment of a high power compact universal unidirectional or bidirectional efficient DC-to-DC converter of the present invention with converter controls looking from the bottom of the single converter control circuitry board 50 and two SiC MOSFET modules 40 mounted (FIG. 7(*a*)) below the single converter control circuitry board.

The power terminals 52 of the SiC MOSFET modules are not connected to the converter's single converter control circuitry board and are interconnected by sufficiently thick copper buses 53 rated to conduct 750 amperes of converter current.

FIG. 7(*b*) diagrammatically illustrates a top view of the single converter control circuitry board 50. FIG. 7(*a*) and FIG. 7(*b*) illustrates chill plate 51 through which the cold cooling fluid flows through and removes extra heat generated in SiC MOSFET modules 40 (shown in FIG. 7(*a*) and FIG. 7(*c*)) as a result of the high current switching rate.

Figure 7C:
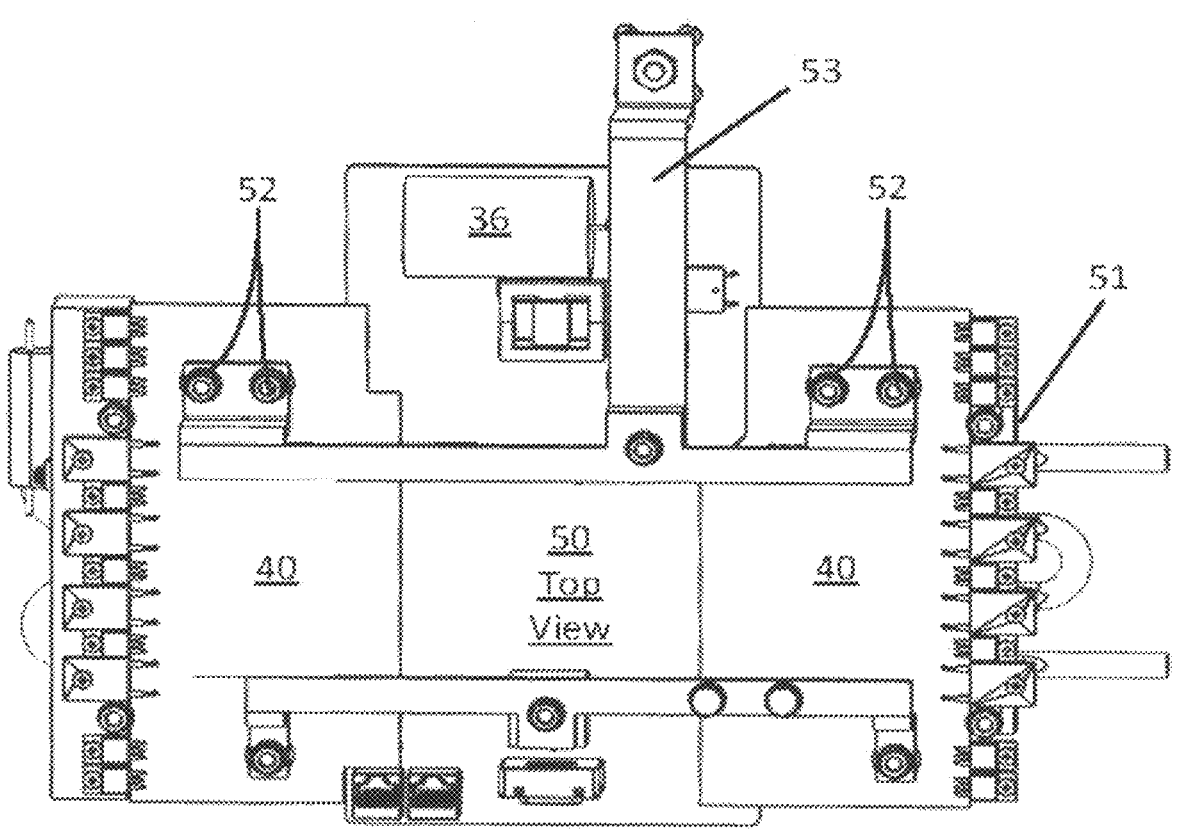

FIG. 7(c) is a second top diagrammatic view showing the relative positioning of the single converter control circuitry board 50 and SiC MOSFET modules 40 utilized in one example of the present invention.

In renewable energy applications, the voltage ranges of the renewable power sources Vin do not overlap with the DC voltage V2 range required by the high power density DC-to-DC converter. In such applications only a boost half bridge or only a buck half bridge circuit configuration of the high power density DC-to-DC converter is sufficient. In such applications of the high power density DC-to-DC converter of the present invention, the two SiC MOSFET modules 40 can be connected in parallel to double the current capability of the high power density compact universal unidirectional or bidirectional efficient DC-to-DC converter. DC buses 53 connect the two SiC MOSFET modules 40 together to form an arrangement of unidirectional FIG. 2(a) or bidirectional FIG. 2(b) high power density DC/DC converter.

Figures 1A, 1B, 1C, 1D:
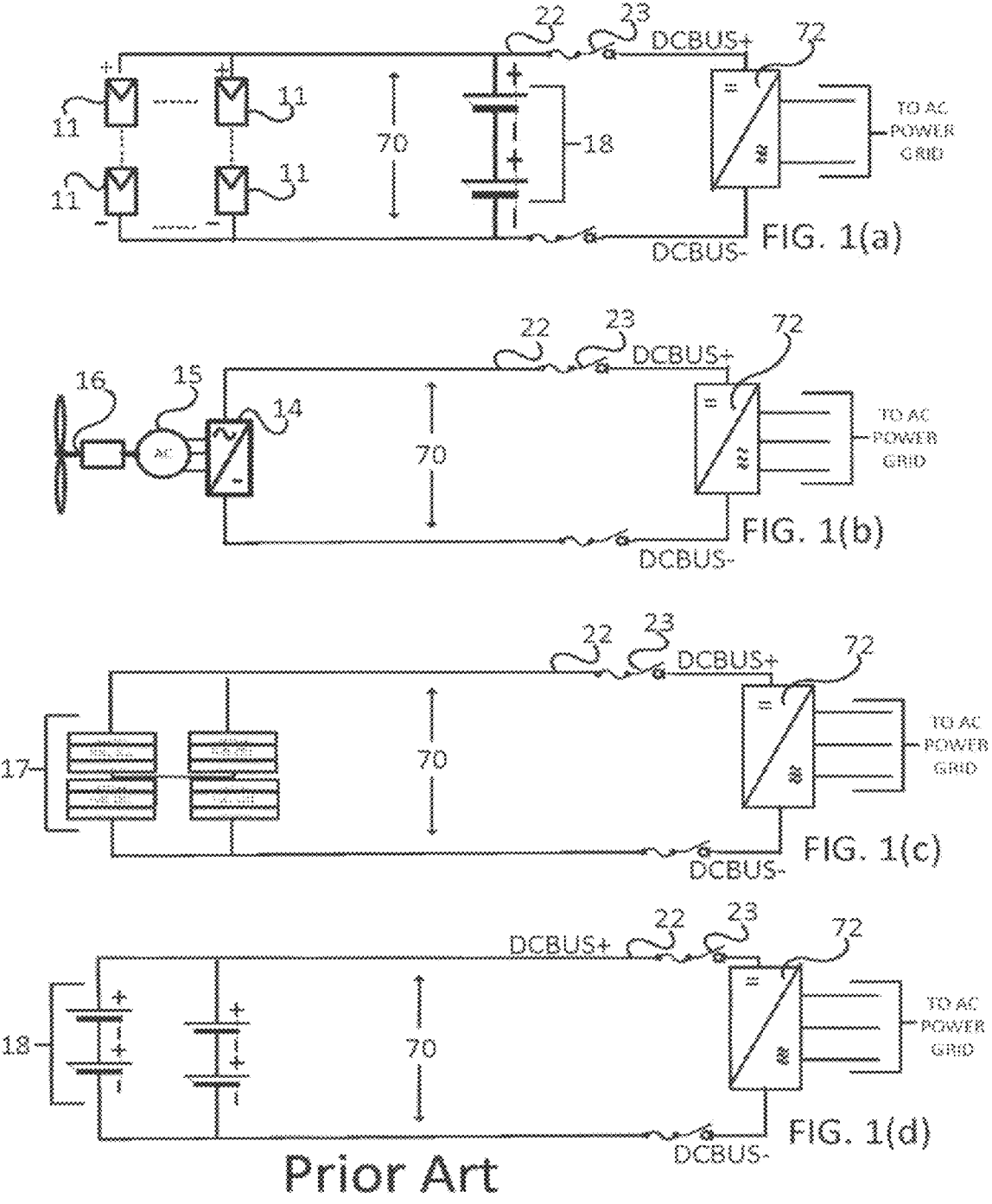
FIG. 1(*a*), FIG. 1(*b*), FIG. 1(*c*) and FIG. 1(*d*) illustrate examples of renewable energy DC power sources connected to a DC bus with a DC-to-AC converter providing alternating power from the DC bus to a grid.
Figures 2, 2B:
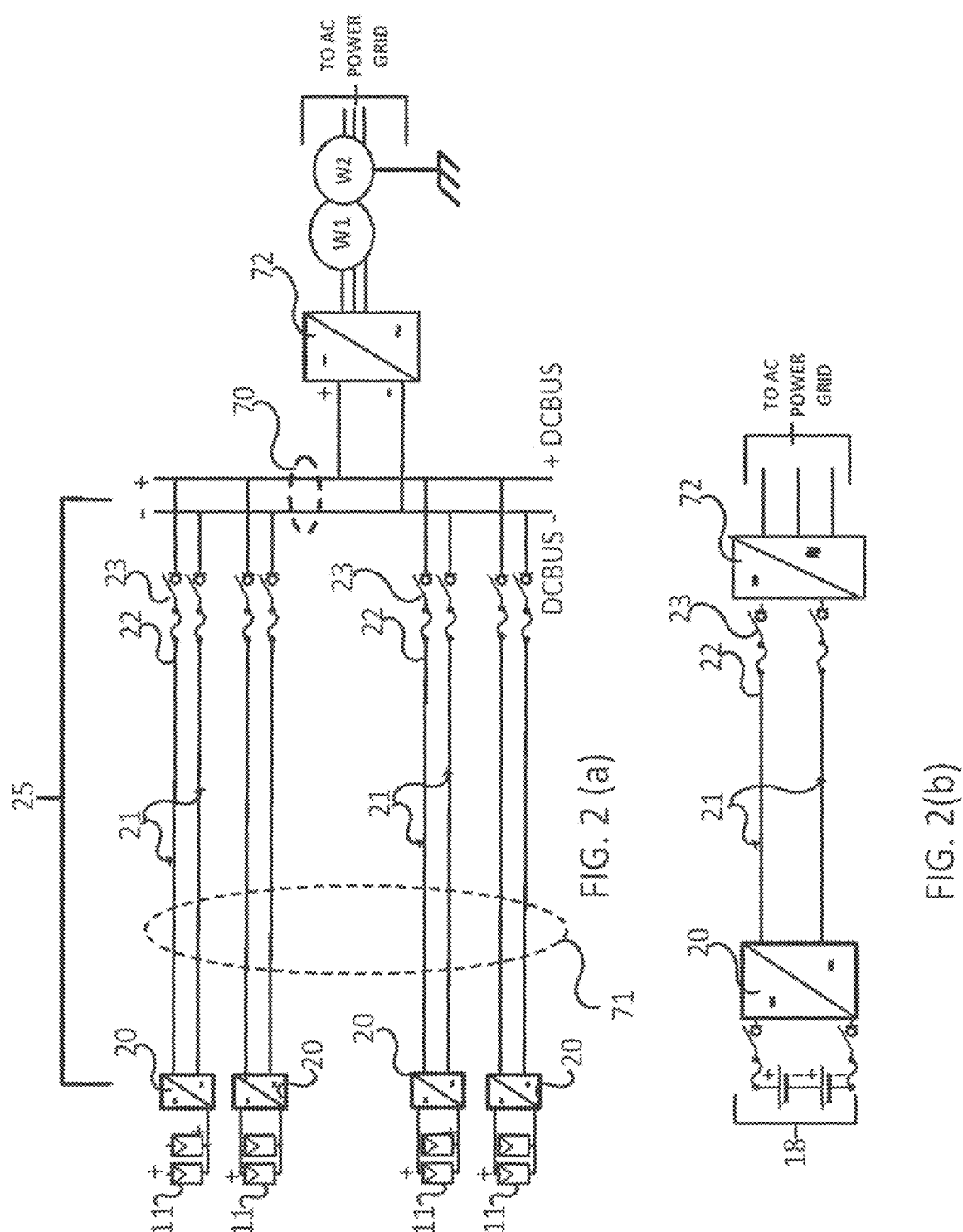
FIG. 2(*a*) and FIG. 2(*b*) illustrate alternative examples of utilizing high power density DC-to-DC converters of the present invention at the output of renewable energy DC power sources with the DC-to-AC converters connecting regulated DC power from the DC power sources via a DC bus to a DC-to-AC converter with output to a grid.
Figures 3A, 3B, 3C:
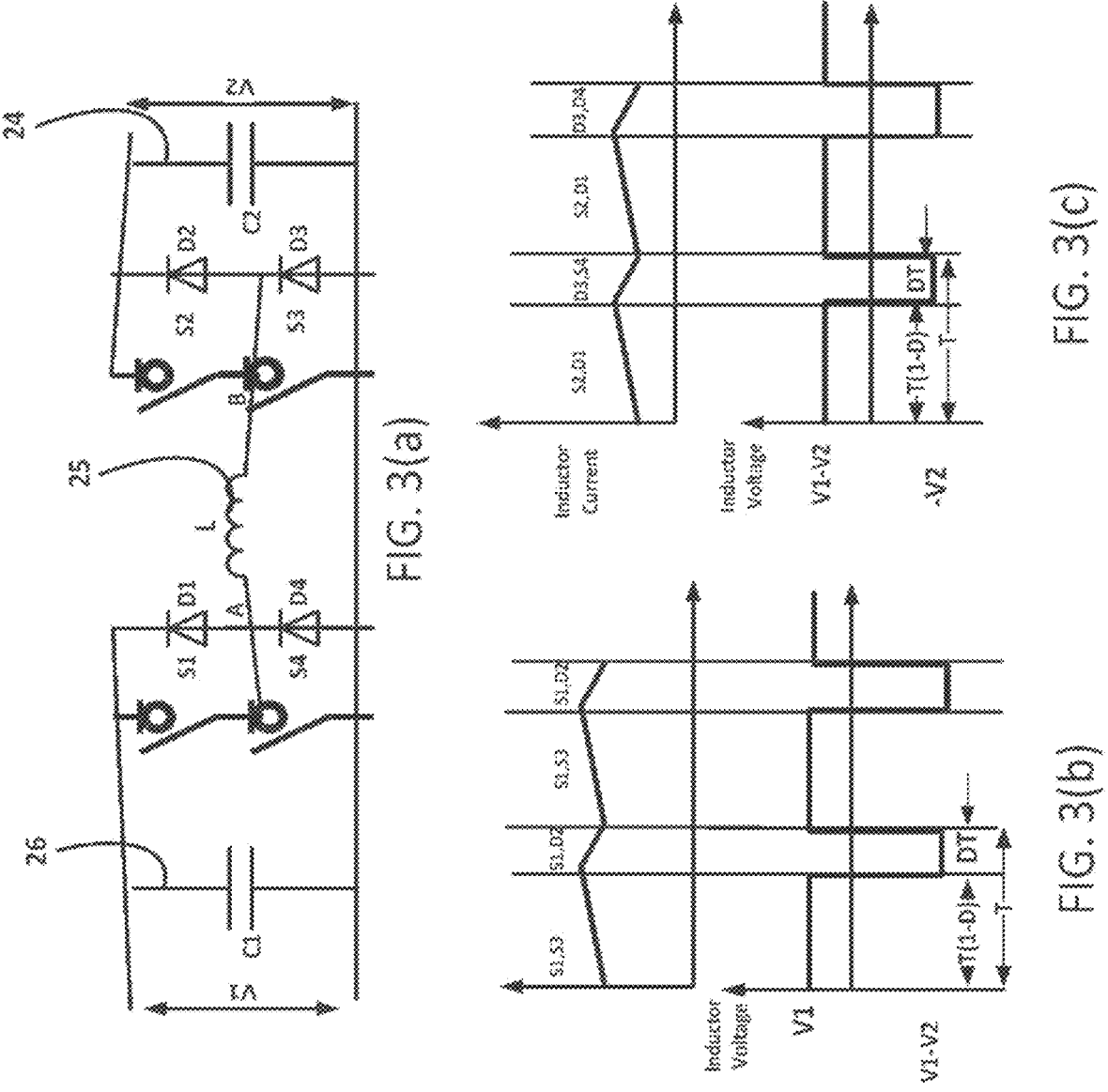
FIG. 3(*a*) schematically illustrates one example of a combination boost/buck DC-to-DC converter utilized in some embodiments of the high power density DC-to-DC converters of the present invention.

In photovoltaic applications, as illustrated in FIG. 2(a), the DC-to-DC converter is unidirectional; that is from the photovoltaic solar panels to DC-to-AC inverter 72. In the battery energy storage application, as shown in FIG. 2(b) the DC-to-DC converter is bidirectional; that is current flows from DC-to-AC inverter 72 to the battery 18 during the battery charging cycle (step-down converter circuit in FIG. 6(b)) and from battery 18 to DC-to-AC inverter 72 during the battery discharging cycle (step-up converter circuit in FIG. 6(a)).

Figure 6C:
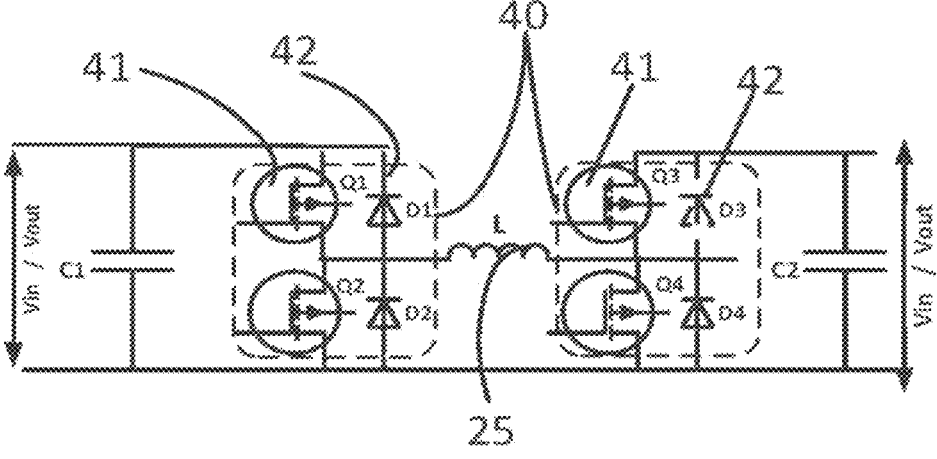

When the high power, compact universal unidirectional or bidirectional efficient DC-to-DC converter's input voltage (Vin/Vout) and output voltage (Vin/Vout) ranges are over-lapping a full bridge configuration is required as shown in FIG. 6(c).

Figures 4A, 4B:
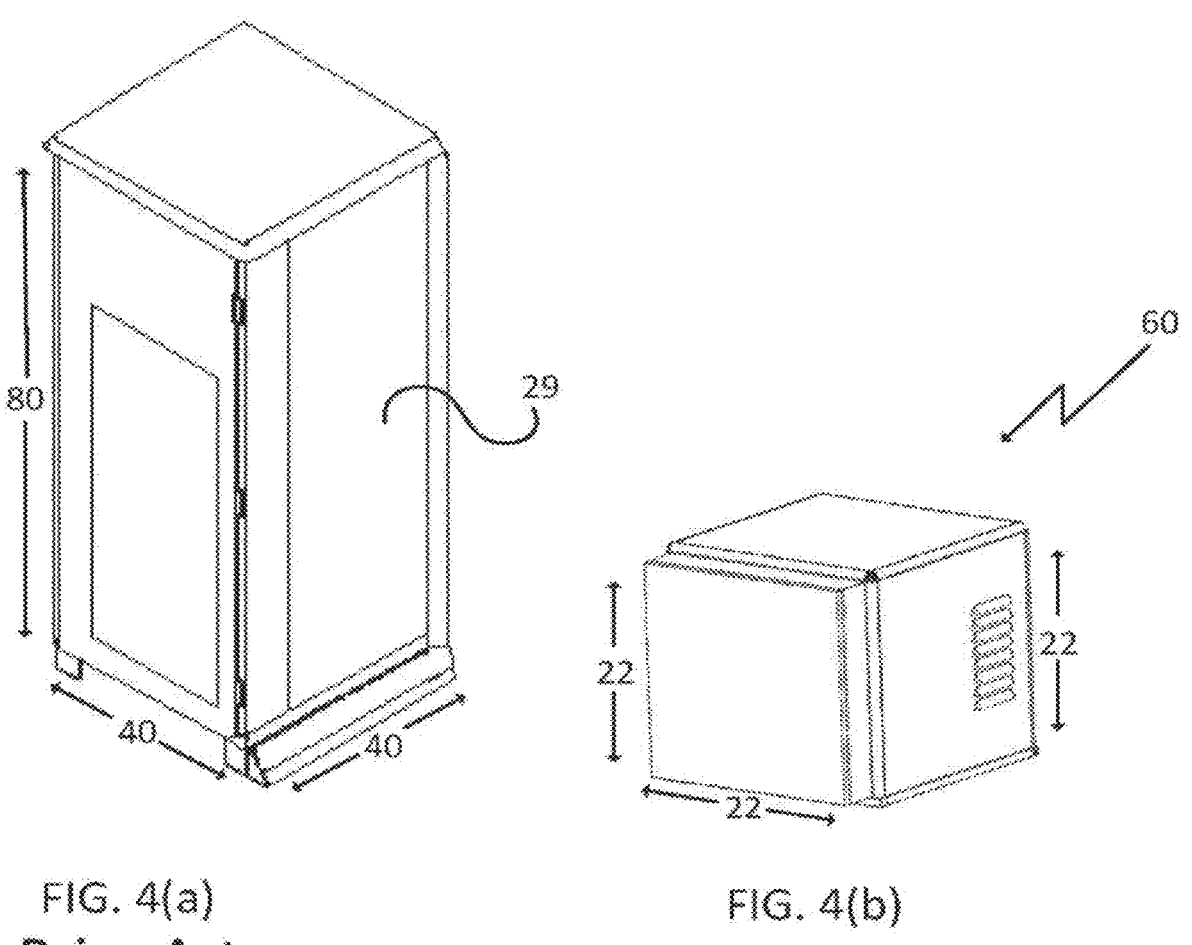
FIG. 4(*a*) and FIG. 4(*b*) respectively compare typical enclosure dimensions for cubic exterior dimensions of an existing DC-to-DC converter in FIG. 4(*a*) and a high power density DC-to-DC converter of the present invention in FIG. 4(*b*).
Figure 8A:
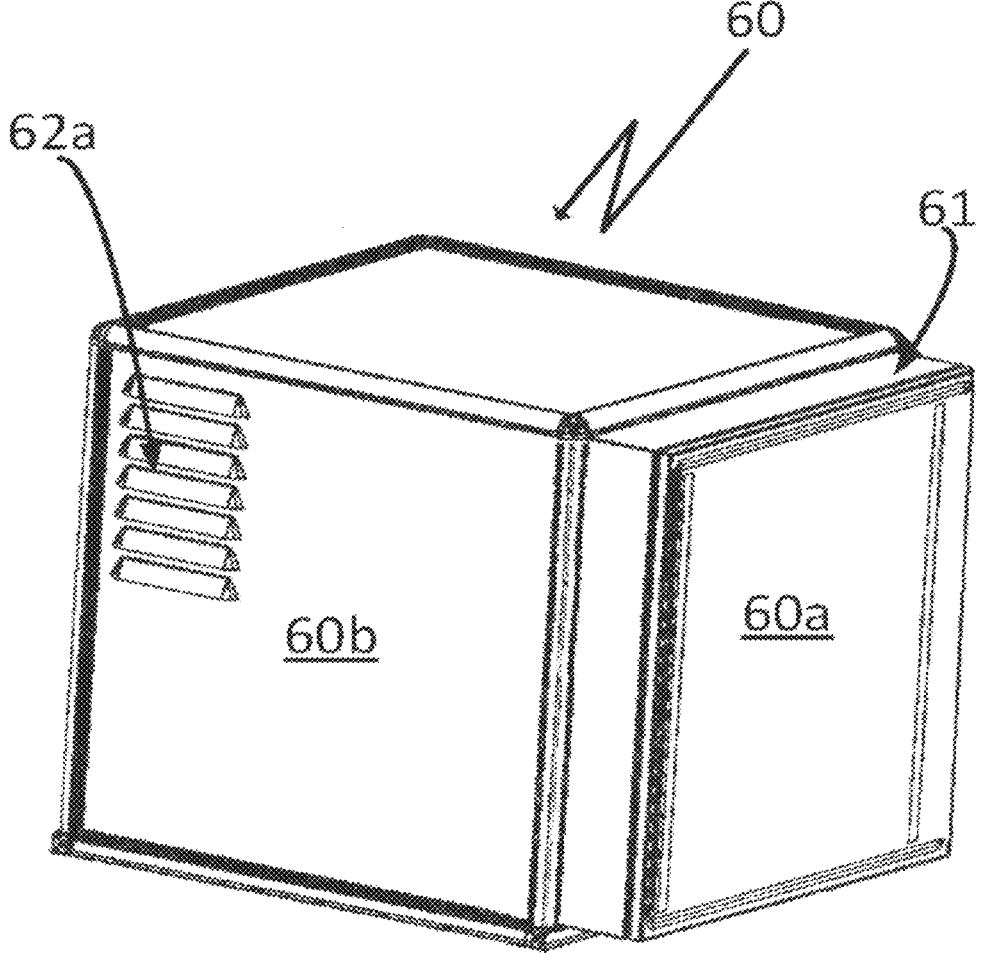
Figure 8B:
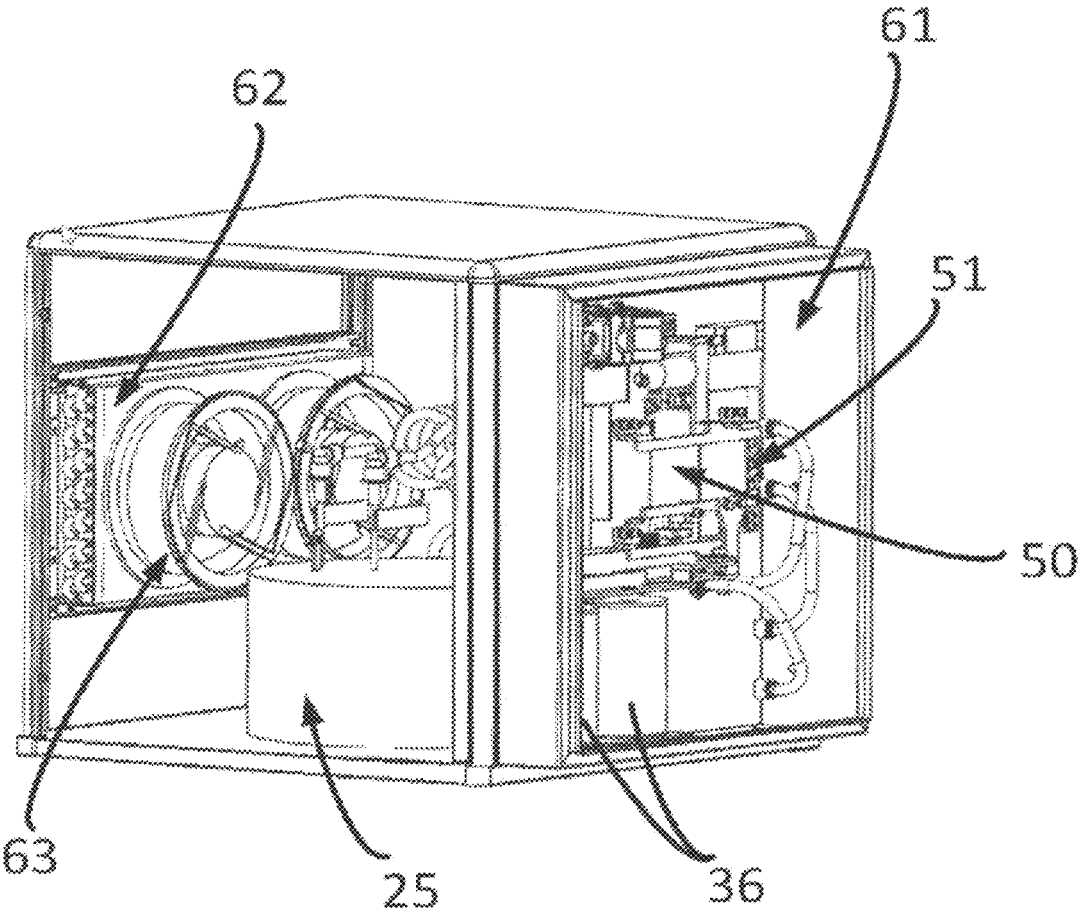

A fully assembled high power compact universal unidi-rectional or bidirectional efficient DC-to-DC converter 60 with all removable enclosure covers installed is shown in FIG. 4(b) and FIG. 8(a). FIG. 8(b) is the high power density compact universal unidirectional or bidirectional efficient DC-to-DC converter of FIG. 8(a) with front removable enclosure cover 60a and side removable cover 60b removed. In this embodiment of the invention the converter's control electronics is installed in front sealed weatherproof com-partment 61, while the remainder of enclosure is open to ambient air flow, for example by louvers 62a. The single converter control circuitry board 50 with the SiC MOSFET modules 40 is attached to chill plate 51. Output capacitors 36 (two in this example) are disposed within the front sealed weatherproof compartment 61, while the energy storing inductor 25 is disposed within the enclosure open to ambient air flow outside of the front sealed weatherproof compart-ment.

Figure 9A:
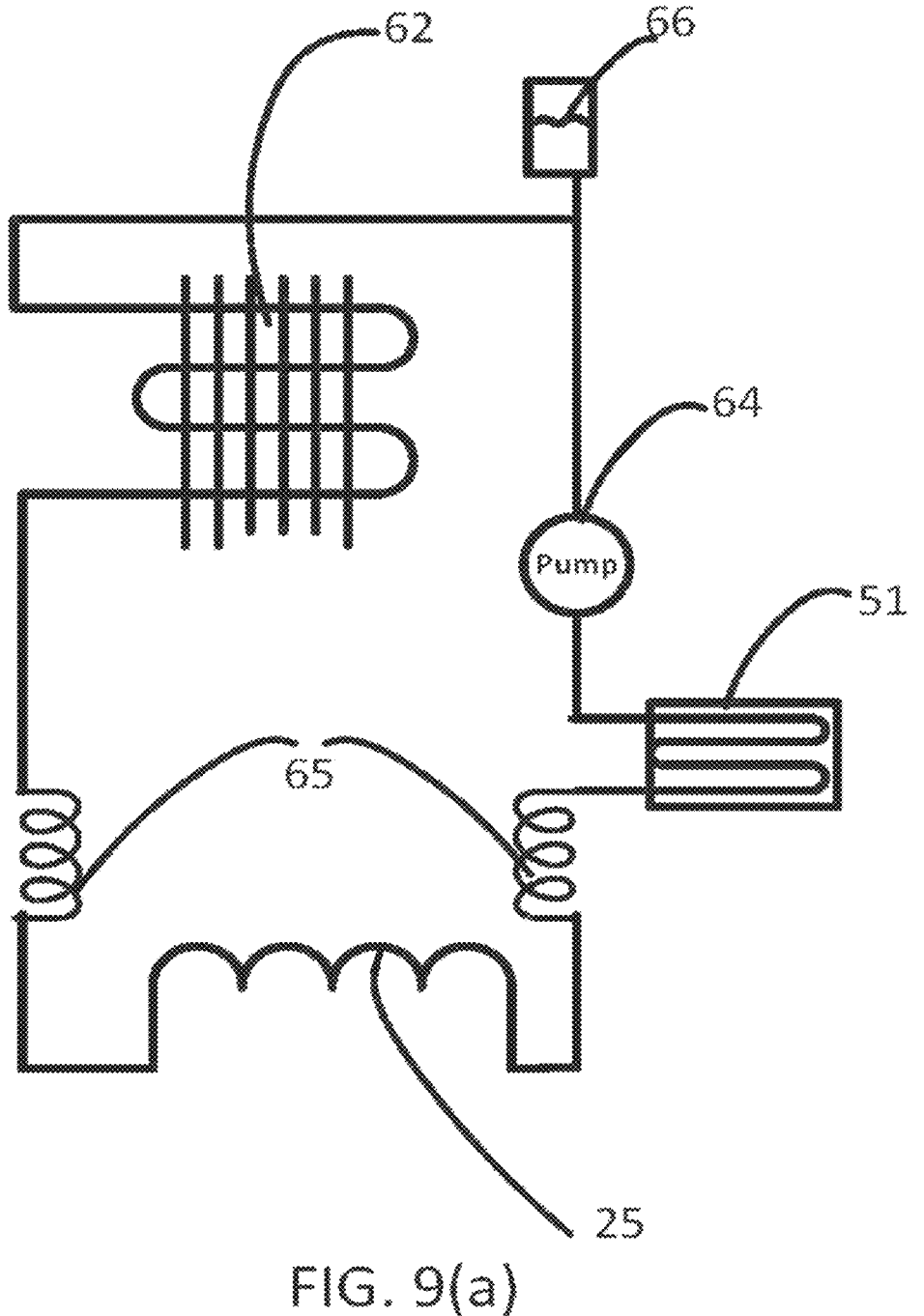
Figure 9B:
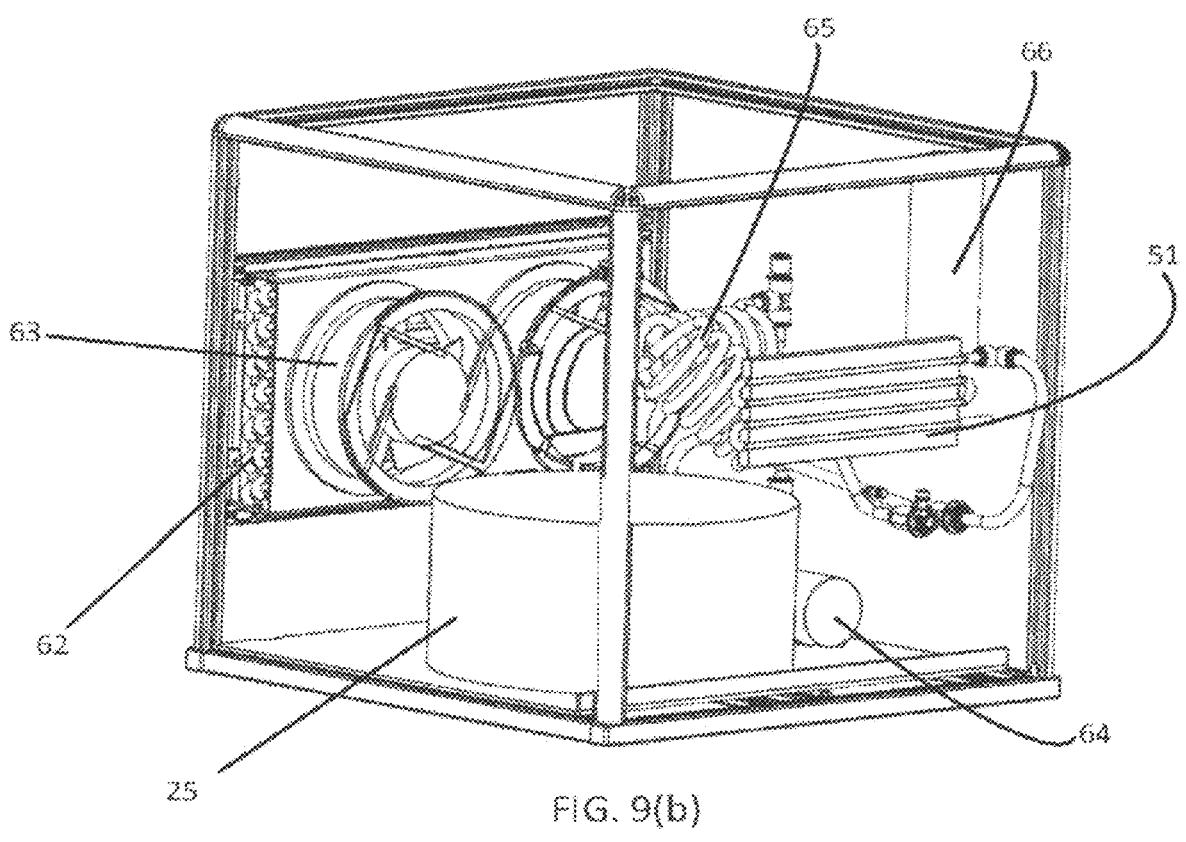

Power components in the high power compact universal unidirectional or bidirectional efficient DC-to-DC converter are cooled by a chilled coolant, for example, deionized water mixed with ethylene glycol, in some embodiments of the invention, to prevent coolant freezing during extremely cold weather conditions. FIG. 9(a) is a diagrammatic of converter forced fluid cooling system. FIG. 9(b) illustrates one embodiment of the converter forced fluid cooling system within high power density DC-to-DC converter housed in a compactly-arranged converter enclosure. The coolant fluid is cooled in the plated air/fluid heat exchanger 62. A large volume of ambient air is propelled through the open enclo-sure by a pair of high-performance fans 63 through the plates of the heat exchanger 62. The fluid flows through copper tubes attached to the heat exchanger's plates to be chilled. In some embodiments of the invention in extremely hot envi-ronments, the air/fluid heat exchanger 62 is replaced by an air conditioned chiller.

The chilled fluid is pumped through the cooling system by pump 64 into chill plate 51, where it removes the heat from SiC MOSFET modules and other components on the single converter control circuitry board 50. After passing through chill plate 51, fluid flows into energy storing power inductor 25 which is wound with thick wall copper tubing. The coolant removes extra heat generated inside the inductor. After exiting the inductor the warm fluid is returned to the air/fluid heat exchanger 62 where it is chilled for the next system cooling cycle.

In some embodiments of the invention the components of the cooling system are interconnected with nonconductive neoprene tubing. To minimize electric leakage current flow through the fluid, in some embodiments of the invention, in addition to using low electrically conductivity fluid, the tubing is formed from extra long (for example 8 to 10 feet) that is coiled into a spiral-shaped tubing 65.

Expansion tank 66 in FIG. 9(a) and FIG. 9(b) is optionally installed to the converter forced fluid cooling system to hold extra volume of warm fluid in the cooling system.

Inductors for high power density DC-to-DC converters known in the art are formed by winding solid copper busbar around a ferromagnetic core formed from a pack of trans-former steel laminations. To prevent saturation of the fer-romagnetic core by the converter's DC current, a substantial air gap is introduced across the ferromagnetic core. The solid copper busbar windings and the ferromagnetic core are air cooled by a stream of air flow through the enclosure.

FIG. 10 illustrates one embodiment of a fluid cooled energy storing power inductor 25 utilized in a high power density DC-to-DC converter of the present invention. Energy storing power inductor 25 is a multilayer inductor wound with hollow copper tubing for flowing a cooling fluid through the hollow tubing.

As shown in FIG. 10 the windings are arranged in the form of a Brooks Coil, which is known in the art as a special configuration of a circular coil inductor with a rectangular cross section that is implemented to achieve the maximum inductance with a given length of conductor. As shown in FIG. 10, the coil has a square cross section, and the inner diameter is equal to twice the height (or width) of the coil winding.

The height h of winding 73 is equal to the winding width w and equal to the inner winding radius r. In this embodi-ment of the invention coolant is introduced via tubing barbs 75 and the electrical current flows through connector plates 76.

The windings are encapsulated in cylindrical potting material enclosure 74. The potting material is mixed with ferromagnetic granules that enhance the magnetic value of the Brooks Coil.

The invention claimed is:

1. A high power density DC-to-DC converter, comprising:
   a converter enclosure;
   a converter input and a converter output housed in the converter enclosure, the converter input configured to connect to a DC output of a high power renewable energy source, and the converter output configured to connect to a DC inverter input of a DC-to-AC inverter having an AC inverter output connected to an electrical grid;
   an arrangement of high switching frequency Silicon-Carbide power MOSFET semiconductor power mod-ules forming a selectable converter half-bridge or full-bridge in the converter enclosure by reconnection of a converter bus bar within the converter enclosure; and a converter forced fluid closed cooling system disposed within the converter enclosure, the converter forced fluid closed cooling system including an interconnecting fluid cooled hollow copper tubing and one or more chill plates configured to cool the arrangement of high switching frequency Silicon-Carbide power MOSFET semiconductor power modules.

2. The high power density DC-to-DC converter of claim 1, wherein the high power density DC-to-DC converter further comprises a compact energy storing inductor forming a converter power inductor in the converter enclosure.

3. The high power density DC-to-DC converter of claim 1, further comprising a single converter circuitry board disposed within the converter enclosure for mounting a converter control circuitry, the single converter circuitry board configured for a mounting and an integration of the arrangement of high switching frequency Silicon-Carbide power MOSFET semiconductor power modules and the converter control circuitry disposed on the single converter circuitry board.

4. A high power density DC-to-DC converter, comprising:
a converter enclosure;
a converter input and a converter output housed in the converter enclosure, the converter input configured to connect to a DC output of a high power renewable energy source, and the converter output configured to connect to a DC inverter input of a DC-to-AC inverter having an AC inverter output connected to an electrical grid;
a converter bus bar within the converter enclosure
an arrangement of high switching frequency Silicon-Carbide power MOSFET semiconductor power modules forming a selectable converter half-bridge or full-bridge in the converter enclosure by reconnection of the converter bus bar; and
a converter forced fluid closed cooling system disposed within the converter enclosure and having one or more chill plates configured to cool the arrangement of high switching frequency Silicon-Carbide power MOSFET semiconductor power modules, wherein the converter forced fluid closed cooling system further comprises:
a fluid-to-air plated heat exchanger disposed within the converter enclosure for a heated air transfer from the converter enclosure to ambient air;
a closed-system cooling fluid circulating pump disposed within the converter enclosure for circulating a cooling fluid in the converter forced fluid closed cooling system;
an expansion tank disposed within the converter enclosure for accumulating heat-expanded cooling fluid within the converter forced fluid closed cooling system; and
an energy storing compact inductor comprising a hollow tube wound inductor for circulation of the cooling fluid within the hollow tube wound inductor.

5. The high power density DC-to-DC converter of claim 2, wherein the compact energy storing inductor comprises a Brooks coil having a potting material mixed with a plurality of ferromagnetic granules.

6. The high power density DC-to-DC converter of claim 4, wherein the converter forced fluid closed cooling system further includes an interconnecting fluid cooled hollow copper tubing.

7. The high power density DC-to-DC converter of claim 4, wherein the fluid-to-air plated heat exchanger, the closed-system cooling fluid circulating pump, the expansion tank, the one or more chill plates, and the hollow tube wound inductor are interconnected with an electrically non-conductive tubing.

8. The high power density DC-to-DC converter of claim 7, wherein the fluid-to-air plated heat exchanger is chilled by a flow of the ambient air through the converter enclosure by one or more ambient air supply fans disposed in the converter enclosure.

9. The high power density DC-to-DC converter of claim 1, wherein the converter enclosure has an interior volume no greater than 6.2 cubic feet containing a conversion high power density of at least 80 kilowatts per cubic foot for the high power density DC-to-DC converter.

10. A method of forming an electric power supply system from a renewable energy source having a DC power output, the method comprising:
converting the DC power output of the renewable energy source with a high power density DC-to-DC converter, the high power density DC-to-DC converter having a converter input and a converter output housed in a converter enclosure, the converter input of the high power density DC-to-DC converter connected to the DC power output of the renewable energy source, and the converter output of the high power density DC-to-DC converter connected to a DC inverter input of a DC-to-AC inverter having an AC inverter output connected to an electrical grid;
forming a selectable converter half-bridge or full-bridge in the converter enclosure by reconnection of a converter bus bar within the converter enclosure using an arrangement of high switching frequency Silicon-Carbide power MOSFET semiconductor power modules; and
cooling the arrangement of high switching frequency Silicon-Carbide power MOSFET semiconductor power modules using a converter forced fluid closed cooling system disposed within the converter enclosure, the converter forced fluid closed cooling system including an interconnecting fluid cooled hollow copper tubing and one or more chill plates.

11. The method of claim 10, further comprising forming the high power density DC-to-DC converter with a compact converter energy storing inductor.

12. The method of claim 10, wherein the one or more chill plates are disposed adjacent to the high switching frequency Silicon-Carbide power MOSFET semiconductor power modules for cooling the high switching frequency Silicon-Carbide power MOSFET semiconductor power modules.

13. The method of claim 10, wherein the high power density DC-to-DC converter contains a single converter assembly printed circuit board, the high switching frequency Silicon-Carbide power MOSFET semiconductor power modules and a converter assembly circuitry disposed on the single converter assembly printed circuit board.

14. The method of claim 11, wherein the compact converter energy storing inductor is formed from a Brooks coil having a potting material mixed with a plurality of ferromagnetic granules.

15. The method of claim 12, further comprising forming the converter forced fluid closed cooling system with a fluid-to-air plated heat exchanger chilled by a flow of an ambient air through the converter enclosure of each of the high power density DC-to-DC converters by one or more ambient air supply fans disposed in the enclosure.

16. The method of claim 10, wherein the converter enclosure has an interior volume no greater than 6.2 cubic feet for a containment of a conversion power density of at least 80 kilowatts per cubic foot.

17. The method of claim 10, wherein the converter forced fluid closed cooling system further comprises a cooling fluid circulating pump disposed within the converter enclosure and configured to circulate a cooling fluid in the converter forced fluid closed cooling system.

18. The method of claim 17, wherein the converter forced fluid closed cooling system further comprises an expansion tank disposed within the converter enclosure for accumulating heat-expanded cooling fluid within the converter forced fluid closed cooling system.

19. The method of claim 18, wherein the converter forced fluid closed cooling system further comprises an energy storing inductor comprising a hollow tube wound inductor for circulation of the cooling fluid within the hollow tube wound inductor.

20. The method of claim 19, wherein a fluid-to-air plated heat exchanger, the cooling fluid circulating pump, the expansion tank, the one or more chill plates, and the hollow tube wound inductor are interconnected with an electrically non-conductive tubing.

\* \* \* \* \*